(12) United States Patent
Matsushita et al.

(10) Patent No.: US 12,464,695 B2
(45) Date of Patent: Nov. 4, 2025

(54) ELECTROMAGNETIC WAVE SHIELDING MATERIAL AND METHOD FOR MANUFACTURING SAME

(71) Applicant: YUHO CO., LTD., Osaka (JP)

(72) Inventors: Masaya Matsushita, Osaka (JP); Shinji Nojima, Osaka (JP)

(73) Assignee: YUHO CO., LTD., Osaka (JP)

( * ) Notice: Subject to any disclaimer, the term of this patent is extended or adjusted under 35 U.S.C. 154(b) by 37 days.

(21) Appl. No.: 18/275,750

(22) PCT Filed: Feb. 10, 2022

(86) PCT No.: PCT/JP2022/005432
§ 371 (c)(1),
(2) Date: Aug. 3, 2023

(87) PCT Pub. No.: WO2022/173009
PCT Pub. Date: Aug. 18, 2022

(65) Prior Publication Data
US 2024/0090188 A1 Mar. 14, 2024

(30) Foreign Application Priority Data
Feb. 12, 2021 (JP) ................... 2021-021249

(51) Int. Cl.
*H05K 9/00* (2006.01)

(52) U.S. Cl.
CPC ........... *H05K 9/009* (2013.01); *H05K 9/0088* (2013.01)

(58) Field of Classification Search
CPC ..................................... H05K 9/009
See application file for complete search history.

(56) References Cited

U.S. PATENT DOCUMENTS

| | | | |
|---|---|---|---|
| 2014/0264181 A1* | 9/2014 | Shin | H05K 9/009 |
| | | | 252/478 |
| 2020/0061966 A1* | 2/2020 | Naruse | H05K 9/0075 |
| 2020/0299894 A1 | 9/2020 | Liang et al. | |
| 2021/0307217 A1* | 9/2021 | Miyanaga | C08K 13/04 |
| 2023/0173791 A1* | 6/2023 | Kagumba | B32B 27/12 |
| | | | 343/904 |

FOREIGN PATENT DOCUMENTS

| | | |
|---|---|---|
| JP | 6-53688 | 2/1994 |
| JP | 2001-267787 | 9/2001 |
| JP | 2011-144473 | 7/2011 |
| JP | 2012-229345 | 11/2012 |
| JP | 2016-219466 | 12/2016 |
| JP | 2020-526029 | 8/2020 |

OTHER PUBLICATIONS

International Search Report issued May 10, 2022 in International (PCT) Application No. PCT/JP2022/005432.
Office Action issued Sep. 21, 2023 in Japanese Application No. 2021-021249, with English-language translation.
Extended European Search Report dated Dec. 3, 2024 in European Patent Application No. 22752831.2.
Office Action dated Aug. 21, 2025 in Korean Patent Application No. 10-2023-7027211, with English Translation.

* cited by examiner

*Primary Examiner* — Hung V Ngo
(74) *Attorney, Agent, or Firm* — Wenderoth, Lind & Ponack, L.L.P.

(57) ABSTRACT

An electromagnetic wave shielding material includes a first layer containing an inorganic fiber, and a second layer containing a metal fiber. At least one of the first layer or the second layer contains a resin.

15 Claims, 2 Drawing Sheets

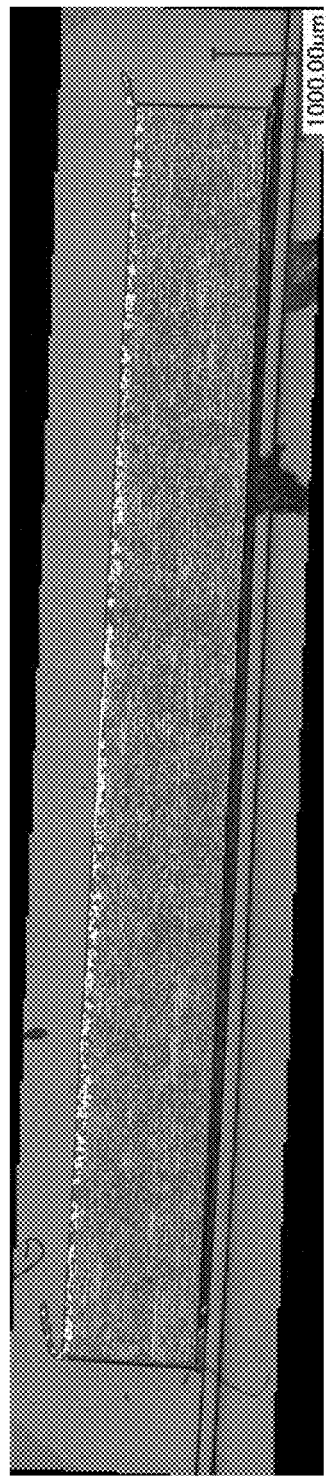
[Fig. 1]

[Fig. 2]
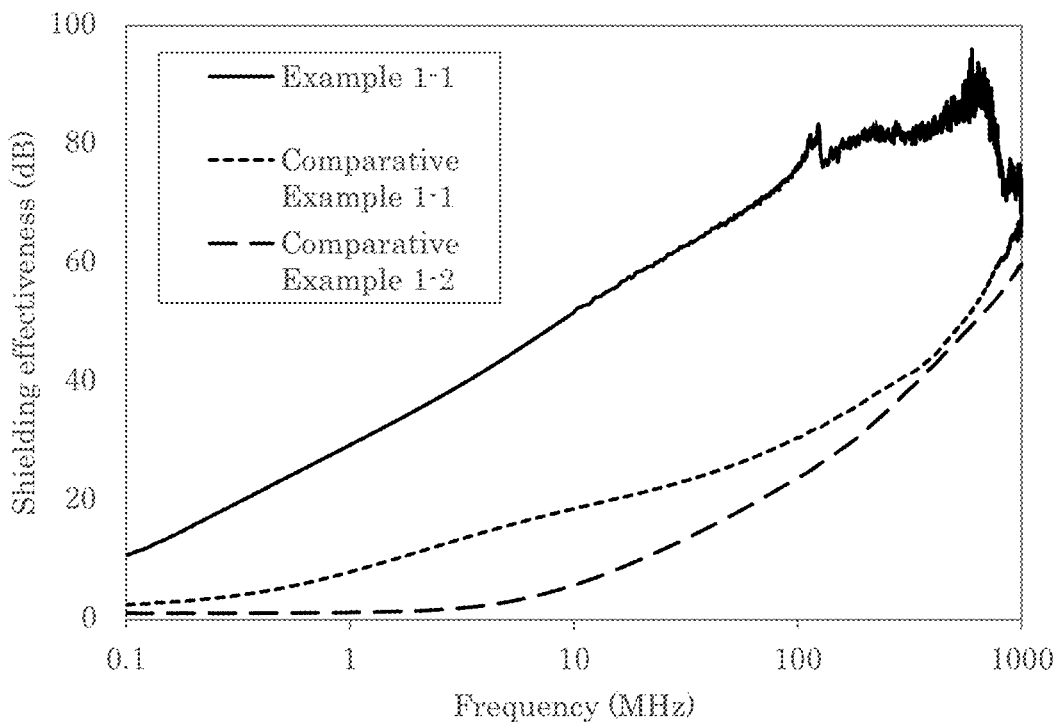
[Fig. 3]
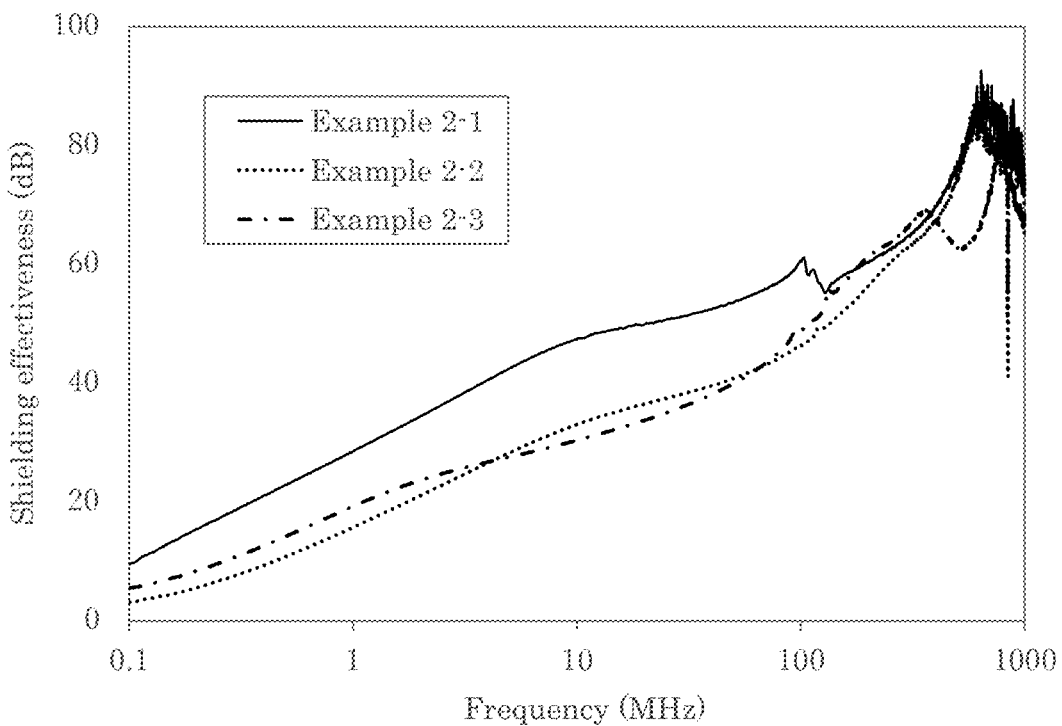

400
ELECTROMAGNETIC WAVE SHIELDING MATERIAL AND METHOD FOR MANUFACTURING SAME

CROSS-REFERENCE TO RELATED APPLICATION

This application claims priority to Japanese Patent Application No. 2021-021249, filed on Feb. 12, 2021. The entire contents of the specification of Japanese Patent Application No. 2021-021249 are hereby incorporated by reference.

TECHNICAL FIELD

The present invention relates to an electromagnetic wave shielding material and a method for manufacturing the same.

BACKGROUND ART

To date, it is required to increase electromagnetic wave shielding ability in housings of devices that generate electromagnetic wave noise due to operation, multi-information displays of car navigation systems, smart meters, and the like, and electronic devices such as on-vehicle cameras and engine control units.

As a molded article that shields electromagnetic waves, for example, Japanese Patent Publication No. 2012-229345 discloses a molded article obtained by molding a molding material containing a carbon fiber, a metal fiber, and a thermoplastic resin. Japanese Patent Publication No. H6-53688 discloses a molded article composed of a conductive-fiber-containing plastic containing a carbon fiber and a metal fiber or a metal-coated fiber.

SUMMARY OF THE INVENTION

Problems to be Solved by the Invention

In recent years, due to an increase in devices that generate electromagnetic wave noise and problems of malfunctioning of devices caused by exogenous noise, a shielding effectiveness for a low frequency magnetic field of, in particular, about 100 kHz to 500 MHz is required. However, with the molded article of Japanese Patent Publication No. 2012-229345 or Japanese Patent Publication No. H6-53688, a low frequency magnetic field of about 100 kHz to 500 MHz could not be sufficiently shielded.

An object of the present invention is to provide an electromagnetic wave shielding material that can effectively shield a low frequency magnetic field.

Solution to the Problems

The present inventors conducted thorough studies in order to solve the above problem, and found that a low frequency magnetic field can be effectively shielded by using an electromagnetic wave shielding material including: a layer A containing an inorganic fiber; and a layer B containing a metal fiber, in which at least one of the layer A and the layer B contains a resin.

That is, the present invention includes the invention below.

[1] An electromagnetic wave shielding material comprising: a layer A containing an inorganic fiber; and a layer B containing a metal fiber, wherein at least one of the layer A and the layer B contains a resin.

[2] The electromagnetic wave shielding material according to the above [1], wherein the inorganic fiber contains at least one type from among a carbon fiber, a glass fiber, and a natural mineral fiber.

[3] The electromagnetic wave shielding material according to the above [1] or [2], having a thickness of 0.5 to 6.0 mm.

[4] The electromagnetic wave shielding material according to any one of the above [1] to [3], having a weight per unit area of 500 to 5000 g/m².

[5] The electromagnetic wave shielding material according to any one of the above [1] to [4], wherein a content of the metal fiber, out of fibers contained in the layer B, is 90% or more.

[6] The electromagnetic wave shielding material according to any one of the above [1] to [5], wherein the resin is a thermoplastic resin.

[7] A molded body being the electromagnetic wave shielding material according to any one of the above [1] to [6].

[8] A manufacturing method for manufacturing the electromagnetic wave shielding material according to the above [6], the manufacturing method comprising: a step of laminating at least one inorganic-fiber-containing nonwoven fabric a and at least one metal-fiber-containing nonwoven fabric b; and a step of heating and pressing the laminated nonwoven fabrics, wherein at least one of the nonwoven fabric a and the nonwoven fabric b contains a thermoplastic resin.

Effect of the Invention

When the electromagnetic wave shielding material including: a layer A containing an inorganic fiber; and a layer B containing a metal fiber, in which at least one of the layer A and the layer B contains a resin is used, a low frequency magnetic field can be effectively shielded.

BRIEF DESCRIPTION OF THE DRAWINGS

FIG. 1 is a photograph of a cross section of a molded body of Example 1.

FIG. 2 shows a relationship between frequency and magnetic field shielding characteristics in Example 1-1 and Comparative Examples 1-1 to 2.

FIG. 3 shows a relationship between frequency and magnetic field shielding characteristics in Examples 2-1 to 3.

DESCRIPTION OF EMBODIMENTS

An electromagnetic wave shielding material of the present invention includes: a layer A containing an inorganic fiber; and a layer B containing a metal fiber. In the electromagnetic wave shielding material of the present invention, at least one of the layer A and the layer B contains a resin, and preferably, the layer A contains a resin. In the present specification, the metal fiber is not included in the inorganic fiber.

<Layer A>

The inorganic fiber contained in the layer A is not limited in particular, but the inorganic fiber preferably contains at least one type from among a carbon fiber, a glass fiber, and a natural mineral fiber, more preferably contains at least one type from among a carbon fiber and a glass fiber, and further preferably contains a carbon fiber.

The carbon fiber is not limited in particular. Examples thereof include a PAN-based carbon fiber, a pitch-based carbon fiber, a rayon-based carbon fiber, a cellulose-based carbon fiber, a vapor phase growth-based carbon fiber, and a graphitized fiber of these, and one type or two or more types can be used. Preferably, the carbon fiber contains a PAN-based carbon fiber. The PAN-based carbon fiber is a carbon fiber whose raw material is a polyacrylonitrile fiber. The pitch-based carbon fiber is a carbon fiber whose raw material is petroleum tar or petroleum pitch. The cellulose-based carbon fiber is a carbon fiber whose raw material is viscose rayon, cellulose acetate, or the like. The vapor phase growth-based carbon fiber is a carbon fiber whose raw material is hydrocarbon or the like.

The average fiber length of the inorganic fiber is preferably 15 to 100 mm, more preferably 30 to 90 mm, and further preferably 40 to 80 mm. When the average fiber length is 15 mm or more, the mechanical strength of the layer A is easily maintained, and accordingly, the mechanical strength of the electromagnetic wave shielding material is easily maintained. When the average fiber length is 100 mm or less, the dispersibility of the inorganic fiber in the layer A can be increased.

The layer A may contain only the inorganic fiber, or may contain the inorganic fiber and a resin. However, the inorganic fiber has weaker dispersibility and entanglement between fibers than another fiber such as a metal fiber, and thus, preferably contains the inorganic fiber and a resin.

The resin contained in the layer A is not limited in particular, and may be a thermoplastic resin or a thermosetting resin. Preferably, the resin is a thermoplastic resin. The thermoplastic resin is not limited in particular as long as the thermoplastic resin is a synthetic resin that has elasticity and is less likely to be deformed at normal temperature, and that is softened by heat to be able to be molded into a desired shape. Examples thereof include a polyolefin resin, a polyester resin, a polyamide resin, a polyurethane resin, a (meth)acrylic resin, a polycarbonate resin, a polystyrene resin, and a polyphenylene sulfide resin. Examples of the thermosetting resin include a phenol resin, an epoxy resin, a urea resin, a melamine resin, and a diallyl phthalate resin.

The thermoplastic resin may be an acid-modified thermoplastic resin. The acid-modified thermoplastic resin is a thermoplastic resin in which an acid-modifying group has been introduced through acid-modification. The type of the acid-modifying group is not limited in particular. The acid-modifying group may be of one type, or may be of two or more types, and is preferably a carboxylic acid anhydride residue (—CO—O—OC—) or a carboxylic acid residue (—COOH). The acid-modifying group may be introduced by any compound. Examples of the carboxylic acid anhydride include maleic anhydride, itaconic anhydride, succinic anhydride, glutaric anhydride, and adipic anhydride. Examples of the carboxylic acid include maleic acid, itaconic acid, fumaric acid, acrylic acid, and methacrylic acid. In particular, a carboxylic acid is preferable, and maleic acid is more preferable. In the present specification, "thermoplastic resin" includes both an acid-modified thermoplastic resin and a non-acid-modified thermoplastic resin.

The content of the inorganic fiber in the layer A is preferably 10 mass % or more, more preferably 20 mass % or more, and further preferably 30 mass % or more, and preferably 70 mass % or less, more preferably 60 mass % or less, and further preferably 50 mass % or less.

The content of the resin in the layer A is preferably 20 mass % or more, more preferably 35 mass % or more, and further preferably 50 mass % or more, and preferably 80 mass % or less and more preferably 70 mass % or less.

The total content of the inorganic fiber and the resin in the layer A is preferably 50 mass % or more, more preferably 70 mass % or more, further preferably 90 mass % or more, particularly preferably 95 mass %, and most preferably 100 mass %.

The layer A may contain a metal fiber within a range in which the effect of the present invention is not impaired, but preferably contains substantially no or no metal fiber. The content of the metal fiber in the layer A is preferably less than 10 mass %, more preferably 5 mass % or less, and further preferably 1 mass % or less.

<Layer B>

The layer B contains a metal fiber. The metal component forming the metal fiber is not limited in particular, and may be: a base metal such as copper, iron, aluminum, nickel, or chromium; an alloy such as stainless steel; or a noble metal such as gold, platinum, silver, palladium, rhodium, iridium, ruthenium, and osmium. Among these, the metal component forming the metal fiber is preferably at least one type from among a base metal and an alloy, and more preferably a base metal from the viewpoint of productivity and material cost, and further preferably copper, from the viewpoint that the electric conductivity is high, and high shielding ability can be expected even in a relatively thin layer.

The fiber diameter of the metal fiber is preferably 10 to 100 μm and more preferably 20 to 70 μm. When the fiber diameter is 10 μm or more, the mechanical strength of the layer B is easily maintained, and accordingly, the mechanical strength of the electromagnetic wave shielding material is easily maintained. When the fiber diameter is 100 μm or less, dispersibility of the metal fiber in the layer B can be increased.

The content of the metal fiber in the layer B is preferably 50 mass % or more, more preferably 70 mass % or more, further preferably 90 mass % or more, and particularly preferably 95 mass % or more.

The layer B may or may not contain a resin. The content of the resin in the layer B is preferably 50 mass % or less, more preferably 30 mass % or less, and further preferably 10 mass % or less.

The total content of the metal fiber and the resin in the layer B is preferably 50 mass % or more, more preferably 70 mass % or more, further preferably 90 mass % or more, particularly preferably 95 mass %, and most preferably 100 mass %.

The layer B may contain an inorganic fiber within a range in which the effect of the present invention is not impaired. The content of the inorganic fiber in the layer B is preferably less than 10 mass %, more preferably 5 mass % or less, and further preferably 1 mass % or less.

The content of the metal fiber, out of fibers contained in the layer B, is preferably 90% or more and more preferably 100%. With respect to a plane perpendicular to the thickness direction in a substantially center portion in the thickness direction of the layer B, an image of a 200 μm square is captured by using an optical microscope, the quantities of the metal fiber and the inorganic fiber included in the image are confirmed, and the proportion of the quantity of the metal fiber to the total quantity of the metal fiber and the inorganic fiber is defined as the content of the metal fiber. It is not required that the entire face of the layer B is covered by the metal fiber or that the content of the metal fiber in the entire face of the layer B is 90% or more. The layer B only needs to include a region in which the content of the metal fiber is 90% or more, and a region in which the metal fiber is not dispersed partially to an extent that the effect of the present invention is not impaired may be present. When one of the vertical and lateral sides of the electromagnetic wave shielding material is less than 200 μm, if the short side is defined as P (µm), an image of P (µm)×200 (µm) is captured, and the proportion of the quantity of the metal fiber to the total quantity of the metal fiber and the inorganic fiber is calculated. When both of the vertical and lateral sides are less than 200 µm, the quantities of all of the metal fiber and the inorganic fiber present in a plane perpendicular to the thickness direction of the layer B are confirmed, and the proportion of the quantity of the metal fiber to the total quantity of the metal fiber and the inorganic fiber is calculated.

The average fiber length of the metal fiber is preferably 25 to 200 mm, more preferably 50 to 150 mm, and further preferably 80 to 120 mm. When the average fiber length is 25 mm or more, the mechanical strength of the layer B is easily maintained, and accordingly, the mechanical strength of the electromagnetic wave shielding material is easily maintained. When the average fiber length is 200 mm or less, dispersibility of the metal fiber in the layer B can be increased.

<Electromagnetic Wave Shielding Material>

From the viewpoint of smoothly performing processing of a molded article for automobile component application or the like, the weight per unit area of the electromagnetic wave shielding material of the present invention is preferably 500 to 5000 g/m$^2$, more preferably 1000 to 4000 g/m$^2$, further preferably 1500 to 3500 g/m$^2$, further preferably 2000 to 3000 g/m$^2$, and particularly preferably 2000 to 2500 g/m$^2$.

From the viewpoint of smoothly performing processing of a molded article for automobile component application or the like, the thickness of the electromagnetic wave shielding material of the present invention is preferably 0.5 to 6.0 mm, more preferably 1.0 to 5.0 mm, further preferably 1.5 to 4.0 mm, particularly preferably 1.5 to 3.0 mm, and most preferably 1.5 to 2.5 mm.

In the electromagnetic wave shielding material of the present invention, a magnetic field shielding effectiveness SE is: at 0.1 MHz, preferably 3 dB or more and more preferably 8 dB or more; at 1 MHz, preferably 10 dB or more and more preferably 20 dB or more; at 10 MHz, preferably 20 dB or more and more preferably 35 dB or more; at 100 MHz, preferably 40 dB or more and more preferably 50 dB or more; and at 500 MHz, preferably 60 dB or more and more preferably 75 dB or more. Here, the magnetic field shielding effectiveness SE is a value obtained based on the formula below according to a KEC method when the magnetic field intensity of a space where the electromagnetic wave shielding material is absent is defined as M (A/m) and the magnetic field intensity when the electromagnetic wave shielding material is disposed is defined as M' (A/m). The KEC method is a method in which the electromagnetic wave shielding effect is measured by using an electromagnetic wave shielding effect measurement device developed by the KEC Electronic Industry Development Center, and is a known method.

Magnetic field shielding effectiveness SE (dB)= 20·log$_{10}$(M/M')

In the electromagnetic wave shielding material of the present invention, the layer A contains a relatively large amount of the inorganic fiber, and the layer B contains a relatively large amount of the metal fiber. "Contains a relatively large amount of the inorganic fiber" means containing a large amount of the inorganic fiber when compared with the content of the inorganic fiber in the entirety of the electromagnetic wave shielding material. "Contains a relatively large amount of the metal fiber" means containing a large amount of the metal fiber when compared with the content of the metal fiber in the entirety of the electromagnetic wave shielding material. Preferably, the layer A and the layer B are adjacent to each other, but the boundary between the layer A and the layer B need not necessarily be clear. An intermediate layer that contains both the inorganic fiber and the metal fiber may be present between the layer A and the layer B. The layer configuration of the electromagnetic wave shielding material is not limited in particular, and the surface of the electromagnetic wave shielding material may be the layer A or may be the layer B. In the electromagnetic wave shielding material, at least one layer of each of the layer A and the layer B is present. However, two or more layers of each of the layer A and the layer B may be present. The electromagnetic wave shielding material in which the layer A/the layer B are laminated in this order is preferable. For reducing warp at the time of molding, the electromagnetic wave shielding material in which the layer A/the layer B/the layer A are laminated in this order is more preferable.

FIG. 1 is a photograph of a cross section of an electromagnetic wave shielding material (molded body) of Example 1 described later. The layer positioned on the side close to the characters of "1000.00 µm" in FIG. 1 is the layer A. The layer positioned on the side away from the characters of "1000.00 µm" in FIG. 1 and thinner than the layer A is the layer B. From FIG. 1, it is understood that the electromagnetic wave shielding material of Example 1 has the layer A that contains a relatively large amount of the inorganic fiber and the layer B that contains a relatively large amount of the metal fiber. In the molded body of Example 1, the layer B is positioned at the surface of the molded body, but the entirety of the molded body surface need not necessarily be covered by the metal fiber (it is sufficient that a region where the content of the metal fiber is 90% or more is contained), and an area in which the metal fiber is not dispersed partially to an extent that the effect of the present invention is not impaired may be present (see FIG. 1).

As described above, the electromagnetic wave shielding material of the present invention is configured such that: a relatively large amount of the inorganic fiber is present so as to be dispersed in the layer A; and a relatively large amount of the metal fiber is present so as to be dispersed in the layer B. Therefore, the electromagnetic wave shielding material of the present invention is excellent in mechanical characteristics such as bending strength and bending elastic modulus, and thus can also be used in molding that involves elongation.

<Manufacturing Method for Electromagnetic Wave Shielding Material>

A manufacturing method for manufacturing an electromagnetic wave shielding material containing a thermoplastic resin is preferably a manufacturing method including: a step of laminating at least one inorganic-fiber-containing nonwoven fabric a and at least one metal-fiber-containing nonwoven fabric b; and a step of heating and pressing the laminated nonwoven fabrics, in which at least one of the nonwoven fabric a and the nonwoven fabric b contains a thermoplastic resin. In Examples described later, heating and pressing are performed in all of Examples, but heating and pressing are not indispensable. Depending on the embodiment, for example, a laminated body (a laminated body not subjected to heating and pressing) obtained by laminating the nonwoven fabric a and the nonwoven fabric b may be used as the electromagnetic wave shielding material. Alternatively, a laminated body obtained by laminating the nonwoven fabric a and the nonwoven fabric b and subjected to only heating may be used as the electromagnetic wave shielding material. More preferably, the manufacturing method for manufacturing the electromagnetic wave shielding material containing the thermoplastic resin includes: a step of laminating at least one inorganic-fiber-containing nonwoven fabric a and at least one metal-fiber-containing nonwoven fabric b; and a step of hot-press-molding the laminated nonwoven fabrics, in which the nonwoven fabric a contains a resin.

A manufacturing method for manufacturing an electromagnetic wave shielding material containing a thermosetting resin is preferably a manufacturing method including: a step of laminating at least one inorganic-fiber-containing nonwoven fabric a and at least one metal-fiber-containing nonwoven fabric b; a step of adding a thermosetting resin composition to the laminated nonwoven fabrics; and a step of curing the thermosetting resin composition by heating. Pressing may be performed during the heating.

The method of heating/pressing the laminated nonwoven fabrics is not limited in particular, and a known method can be used. For example, from the viewpoint of operability and versatility, it is preferable to perform press molding by using a hot pressing machine. In consideration of the strength of a molded body to be obtained, the pressure to be applied is preferably 0.1 to 15 MPa, more preferably 0.5 to 10 MPa, and further preferably 1 to 7 MPa. The heating time is preferably 30 to 300 seconds, more preferably 40 to 240 seconds, and further preferably 50 to 180 seconds. When a thermoplastic resin is used, the heating temperature is, in consideration of the melting point of the resin contained in the nonwoven fabric a, preferably the melting point of the resin to the melting point+100° C., more preferably the melting point of the resin+20° C. to the melting point+100° C., and further preferably the melting point of the resin+40° C. to the melting point+100° C. When the resin is polypropylene, the heating temperature is preferably 160 to 270° C., more preferably 180 to 260° C., and further preferably 200 to 250° C. When a thermosetting resin is used, heating only needs to be performed to a temperature at which the thermosetting resin composition is cured. Therefore, the heating temperature may be determined according to the type of the thermosetting resin to be used, and the thermosetting resin may be manufactured under a known condition.

The electromagnetic wave shielding material can be manufactured by using a thermoplastic resin film containing the inorganic fiber, instead of the inorganic-fiber-containing nonwoven fabric a. The electromagnetic wave shielding material can also be manufactured by using a thermoplastic resin film containing the metal fiber, instead of the metal-fiber-containing nonwoven fabric b. An example of the method for manufacturing the thermoplastic resin film containing the inorganic fiber is a method in which the inorganic fiber is dispersed on a thermoplastic resin film, the thermoplastic resin is melted by heat, and pressing is performed as necessary, thereby integrating the thermoplastic resin film and the inorganic fiber. A thermoplastic resin film containing the metal fiber can also be manufactured in a manner similar to that for the thermoplastic resin film containing the inorganic fiber.

Both the nonwoven fabric a and the nonwoven fabric b may be made of only one nonwoven fabric or two or more nonwoven fabrics. However, it is preferable that two or more nonwoven fabrics a and only one nonwoven fabric b are used.

(Inorganic-Fiber-Containing Nonwoven Fabric a)

Preferably, the nonwoven fabric a contains a thermoplastic resin in addition to the inorganic fiber. As the thermoplastic resin, a thermoplastic resin fiber or a thermoplastic resin particle is preferably used, and more preferably, a thermoplastic resin fiber is used (i.e., the nonwoven fabric a is a nonwoven fabric obtained by blending the inorganic fiber and the thermoplastic resin fiber). From the viewpoint of productivity, material cost, and the like, preferably, the thermoplastic resin fiber is a fiber containing at least one type selected from a polypropylene resin, a polyamide resin, and a polycarbonate resin.

The average fiber length of the thermoplastic resin fiber is preferably 25 to 100 mm, more preferably 30 to 80 mm, and further preferably 40 to 70 mm. When the average fiber length is 25 mm or more, mechanical strength when a molded body composed of the nonwoven fabric containing the inorganic fiber and the thermoplastic resin fiber is molded is improved. When the average fiber length is 100 mm or less, dispersibility of the resin fiber and the thermoplastic resin fiber in the nonwoven fabric is improved, and a uniform nonwoven fabric is easily formed.

The fineness of the thermoplastic resin fiber is preferably 2 to 22 dtex, more preferably 3 to 15 dtex, and further preferably 4 to 10 dtex. When the fineness is 2 dtex or more, or 22 dtex or less, dispersibility of the inorganic fiber and the thermoplastic resin fiber in the nonwoven fabric is improved, and a uniform nonwoven fabric is easily formed.

The weight per unit area of the nonwoven fabric a is preferably 400 to 4000 g/m$^2$, more preferably 800 to 3200 g/m$^2$, further preferably 1200 to 2800 g/m$^2$, and still further preferably 1600 to 2400 g/m$^2$.

In manufacturing the electromagnetic wave shielding material, only one nonwoven fabric a may be used or two or more nonwoven fabrics a may be used. When two or more nonwoven fabrics a are used, the same nonwoven fabrics a may be used, or different nonwoven fabrics a may be used. However, the same nonwoven fabrics a are preferably used. When different nonwoven fabrics a are used, "the content of the inorganic fiber in the nonwoven fabric a" and "the content of the resin in the nonwoven fabric a" denote the content of the inorganic fiber and the content of the resin in all of the nonwoven fabrics a. In the electromagnetic wave shielding material obtained by laminating two or more nonwoven fabrics a, "the weight per unit area of the nonwoven fabric a" denotes the value obtained by totaling the weight per unit area of all of the nonwoven fabrics a.

The manufacturing method for the nonwoven fabric a is not limited in particular. Examples thereof include: (1) a method in which the inorganic fiber and the thermoplastic resin fiber are blended into a sheet shape, and the inorganic fiber and the thermoplastic resin fiber are lastly bonded together, thereby manufacturing the nonwoven fabric a; (2) a method in which resin particles are attached to the inorganic fiber, and then the resultant matter is heated to bond the inorganic fiber and the resin together, thereby manufacturing the nonwoven fabric a; (3) a method in which the inorganic fiber is coated by, impregnated with, or immersed in a resin composition melted in a solvent, and the resultant matter is heated, thereby manufacturing the nonwoven fabric a; and (4) a method in which the nonwoven fabric a is manufactured only from the inorganic fiber. From the viewpoint of uniformly dispersing the inorganic fiber in the nonwoven fabric a, the manufacturing method of (1) above is preferable.

In the manufacturing method of (1) above, specifically, an inorganic fiber bundle is opened, the opened inorganic fiber and the thermoplastic resin fiber are blended at a desired mass ratio (e.g., the inorganic fiber:40 mass %, the thermoplastic resin fiber:60 mass %) into a sheet shape, and the inorganic fiber and the thermoplastic resin fiber are lastly bonded together by heating or pressing, whereby the nonwoven fabric a can be obtained. For example, for blending, a commercially available blender machine can be used. For sheet shaping, a carding method can be used, and for example, a commercially available carding machine such as a carding nonwoven fabric production device can be used to perform carding. For bonding the inorganic fiber and the thermoplastic resin fiber together, a known bonding method such as a thermal bonding method or a resin bonding method can be used, and in particular, thermal bonding is preferably performed by using a belt press machine or the like.

In the manufacturing method of (2) above, for example, by spraying thermoplastic resin particles to the inorganic fiber, resin particles can be attached thereto, and the inorganic fiber having the thermoplastic resin particles attached thereto is heated or pressed to bond the inorganic fiber and the thermoplastic resin together, whereby the nonwoven fabric a can be manufactured.

In the manufacturing method of (3) above, the thermoplastic resin may be used or the thermosetting resin may be used. Examples of the impregnation method include impregnation using a press machine, a double belt press machine, or the like, and a transfer molding method. Examples of the immersion method include a pultrusion method, a prepreg method, and a winding method.

Examples of the manufacturing method of (4) above include: a method in which the inorganic fiber is entangled by a needle-punch or the like; a method in which a sheet of the inorganic fiber caused to have a shorter fiber length is made; a method in which the inorganic fiber is woven by using a loom or the like; and a method in which an inorganic fiber bundle is opened into a sheet shape and then pressed.

(Metal-Fiber-Containing Nonwoven Fabric b)

The manufacturing method for the nonwoven fabric b is not limited in particular, and examples thereof include: a method in which the inorganic fiber is entangled by a needle-punch or the like; a method in which a sheet of the inorganic fiber caused to have a shorter fiber length is made; and a method in which the inorganic fiber is woven by using a loom or the like.

Preferably, the nonwoven fabric b is a nonwoven fabric composed only of the metal fiber, but may contain a resin. The resin contained in the nonwoven fabric b is not limited in particular, and may be a thermoplastic resin or may be a thermosetting resin. Specific examples of the thermoplastic resin and the thermosetting resin contained in the nonwoven fabric b are the same as the resin contained in the nonwoven fabric a, and the manufacturing method for the nonwoven fabric b containing the resin may be any of the manufacturing methods of (1) to (3) described in the manufacturing method for the nonwoven fabric a.

The weight per unit area of the nonwoven fabric b is preferably 100 to 1000 $g/m^2$, more preferably 150 to 700 $g/m^2$, and further preferably 200 to 400 $g/m^2$.

In manufacturing the electromagnetic wave shielding material, only one nonwoven fabric b may be used or two or more nonwoven fabrics b may be used. When two or more nonwoven fabrics b are used, the same nonwoven fabrics b may be used, or different nonwoven fabrics b may be used. When different nonwoven fabrics b are used, in the electromagnetic wave shielding material obtained by laminating two or more nonwoven fabrics b, "the weight per unit area of the nonwoven fabric b" denotes the value obtained by totaling the weight per unit area of all of the nonwoven fabrics b.

EXAMPLES

The present invention is more specifically described by way of the following examples. However, the present invention is not naturally limited to the following examples, and as a matter of course, can be appropriately modified and implemented within the scope of complying with the gist of the descriptions above and below. Those all fall within the technical scope of the present invention.

(Measurement of Weight Per Unit Area)

The mass of a molded body sized 150 mm vertically and 150 mm laterally was measured by using a commercially available electronic scale, and the measured mass was divided by the area (0.225 $m^2$), whereby the weight per unit area (unit: $g/m^2$) of the molded body was calculated.

(Measurement of Apparent Thickness)

In Examples and Comparative Examples, using a commercially available thickness gauge, the apparent thicknesses of a nonwoven fabric laminated body before being press-molded and a molded body after being press-molded were measured, respectively.

(Measurement of Magnetic Field Shielding Ability)

Molded bodies 1 to 6 each sized 150 mm vertically and 150 mm laterally were prepared. Then, using an electromagnetic wave shielding effect measurement device developed by the KEC Electronic Industry Development Center, with respect to each molded body, the magnetic field intensity M (A/m) in a space where the electromagnetic wave shielding material was absent and the magnetic field intensity M' (A/m) when the electromagnetic wave shielding material was disposed were measured at frequencies of 0.1 to 1000 MHz, and the magnetic field shielding effectiveness SE at each frequency was calculated based on the formula below.

$$\text{Magnetic field shielding effectiveness SE (dB)} = 20 \cdot \log_{10}(M/M')$$

In Examples and Comparative Examples below, a carbon fiber (T700 manufactured by TORAY INDUSTRIES, INC., 70 mm cut fiber) was used as the inorganic fiber; a maleic acid-modified polypropylene fiber (manufactured by Daiwabo Co., Ltd., fineness: 4.4 dT, average fiber length: 51 mm) was used as a matrix resin fiber; and a copper fiber (manufactured by NIKKO TECHNO, Ltd., fiber diameter: 50 μm, average fiber length: 100 mm), a nickel fiber (manufactured by NIKKO TECHNO, Ltd., fiber diameter: 40 μm, average fiber length: 100 mm), and an iron fiber (manufactured by NIKKO TECHNO, Ltd., fiber diameter: 50 μm, average fiber length: 100 mm) were used as the metal fiber.

Example 1-1 (Molded Body 1)

40 mass % of the above carbon fiber and 60 mass % of the above maleic acid-modified polypropylene fiber were blended to produce a web by using a carding nonwoven fabric production device. Then, a nonwoven fabric a1 having a thickness of 0.8 mm and a weight per unit area of 250 $g/m^2$ was produced by a low-pressure belt press machine using heat. Next, eight nonwoven fabrics a1 were laminated on one face of a copper fiber nonwoven fabric b1 (weight per unit area: 300 $g/m^2$), manufactured by NIKKO TECHNO, Ltd., which was produced by needle-punching the above copper fiber, whereby a nonwoven fabric laminated body 1 (weight per unit area: 2300 $g/m^2$, apparent thickness: 10 mm) was produced. Then, using a hot pressing machine, the nonwoven fabric laminated body 1 was subjected to press molding under a condition of: a temperature of 230° C.; a pressure of 5 MPa; and a pressing time of 60 seconds. Lastly, cooling was performed, whereby a molded body 1 having a thickness of 2 mm was obtained.

A cross section of the molded body 1 obtained in Example 1 was observed by an optical microscope (VHX-900 manufactured by KEYENCE), and the disposition state of the copper fiber was examined. The content of the copper fiber, out of fibers contained in a 200 μm square on the surface of the molded body 1, was confirmed to be 90% or more. That is, it was found that: in the molded body 1, the layer B (the layer that contains a large amount of the copper fiber when compared with the content of the copper fiber in the entirety of the molded body 1) that contains a relatively large amount of the copper fiber is formed on the layer A that contains a relatively large amount of the carbon fiber; and that the layer B in which the copper fiber is substantially uniformly dispersed is present on the layer A.

Comparative Example 1-1 (Molded Body 2)

40 mass % of the above carbon fiber, 15 mass % of the above copper fiber, and 45 mass % of the above maleic acid-modified polypropylene fiber were blended to produce a web by using a carding nonwoven fabric production device. Then, nine nonwoven fabrics c having a weight per unit area of 250 g/m² was produced by a low-pressure belt press machine using heat. Next, the nine nonwoven fabrics c were laminated to produce a nonwoven fabric laminated body 2 (weight per unit area: 2250 g/m², apparent thickness: 8 mm). Then, using a hot pressing machine, the nonwoven fabric laminated body 2 was subjected to press molding under a condition of: a temperature of 230° C.; a pressure of 5 MPa; and a pressing time of 60 seconds. Lastly, the nonwoven fabric laminated body 2 having been subjected to the press molding was cooled, whereby a molded body 2 having a thickness of 2 mm was obtained.

Comparative Example 1-2 (Molded Body 3)

Nine layers of the above nonwoven fabric a1 were laminated to produce a nonwoven fabric laminated body 3 (weight per unit area: 2250 g/m², apparent thickness: 8 mm). Then, using a hot pressing machine, the nonwoven fabric laminated body 3 was subjected to press molding under a condition of: a temperature of 230° C.; a pressure of 5 MPa; and a pressing time of 60 seconds. Lastly, the nonwoven fabric laminated body 3 having been subjected to the press molding was cooled, whereby a molded body 3 having a thickness of 2 mm was obtained.

The magnetic field shielding effectiveness SE at frequencies of 0.1 to 1000 MHz of the molded bodies 1 to 3 (Example 1-1, Comparative Examples 1-1 to 2) was obtained. FIG. 2 shows a relationship between the frequency and the magnetic field shielding effectiveness SE. Table 1 shows the magnetic field shielding effectiveness SE (unit: dB) of the molded bodies 1 to 3 at frequencies of 0.1 MHz, 1 MHz, 10 MHz, 100 MHz, and 500 MHz.

TABLE 1

| | 0.1 MHz | 1 MHz | 10 MHz | 100 MHz | 500 MHz |
|---|---|---|---|---|---|
| Example 1-1 (molded body 1) | 10.9 | 29.5 | 51.8 | 75.9 | 88.1 |
| Comparative Example 1-1 (molded body 2) | 2.5 | 8.1 | 18.7 | 30.7 | 48.4 |
| Comparative Example 1-2 (molded body 3) | 1.1 | 1.3 | 5.8 | 23.9 | 46.4 |

When compared with the molded body 2 and the molded body 3 which are Comparative Examples, the molded body 1 which is an Example is significantly excellent in the magnetic field shielding effectiveness SE at each of frequencies 0.1 to 500 MHz. Since the molded body 1 is a molded body in which the layer A containing the carbon fiber and the layer B containing the copper fiber are separately present, the molded body 1 can effectively shield the low frequency magnetic field. A molded article of Example 1 had an electric field shielding ability similar to that of a molded article of Comparative Example 1, and Example 1 was a molded article that was excellent not only in the magnetic field shielding ability but also in the electric field shielding ability.

Example 2-1 (Molded Body 4)

Four layers of the above nonwoven fabric a1 were laminated on both faces of the above nonwoven fabric b1 to produce a nonwoven fabric laminated body 4 (weight per unit area: 2300 g/m², apparent thickness: 10 mm). Then, using a hot pressing machine, the nonwoven fabric laminated body 4 was subjected to press molding under a condition of: a temperature of 230° C.; a pressure of 5 MPa; and a pressing time of 60 seconds. Lastly, cooling was performed, whereby a molded body 4 having a thickness of 2 mm was obtained.

Example 2-2 (Molded Body 5)

Except that a nickel fiber nonwoven fabric b2 (weight per unit area: 300 g/m², manufactured by NIKKO TECHNO, Ltd., which was produced by needle-punching the above nickel fiber was used instead of the above nonwoven fabric b1, a molded body was produced in a manner similar to that in Example 2-1, whereby a molded body 5 having a weight per unit area of 2300 g/m² and a thickness of 2 mm was obtained.

Example 2-3 (Molded Body 6)

Except that an iron fiber nonwoven fabric b3 (weight per unit area: 300 g/m²), manufactured by NIKKO TECHNO, Ltd., which was produced by needle-punching the above iron fiber was used instead of the above nonwoven fabric b1, a molded body was produced in a manner similar to that in Example 2-1, whereby a molded body 6 having a weight per unit area of 2300 g/m² and a thickness of 2 mm was obtained.

The magnetic field shielding effectiveness SE at frequencies of 0.1 to 1000 MHz of the molded bodies 4 to 6 (Examples 2-1 to 3) was obtained. FIG. 3 shows a relationship between the frequency and the magnetic field shielding effectiveness SE. Table 2 shows the magnetic field shielding effectiveness SE (unit: dB) of the molded bodies 4 to 6 at frequencies of 0.1 MHz, 1 MHz, 10 MHz, 100 MHz, and 500 MHz.

TABLE 2

| | 0.1 MHz | 1 MHz | 10 MHz | 100 MHz | 500 MHz |
|---|---|---|---|---|---|
| Example 2-1 (molded body 4) | 9.6 | 28.6 | 47.5 | 60.7 | 77.4 |
| Example 2-2 (molded body 5) | 3.1 | 15.8 | 33.1 | 46.5 | 74.9 |
| Example 2-3 (molded body 6) | 5.5 | 19.3 | 30.4 | 49.2 | 63.0 |

The molded bodies 4 to 6 which are Examples are excellent in the magnetic field shielding effectiveness SE at each of frequencies 0.1 to 500 MHz. In particular, the molded body 4 in which the copper fiber was used as the metal fiber is significantly excellent in the magnetic field shielding effectiveness SE. Since the molded bodies 4 to 6 are each a molded body in which the layer A containing the carbon fiber and the layer B containing the metal fiber are separately present, the molded bodies 4 to 6 can effectively shield the low frequency magnetic field. In particular, use of a copper fiber as the metal fiber can significantly increase the shielding ability. Molded articles of Examples 2-1 to 3 each had an electric field shielding ability similar to that of a molded article of Example 1-1, and Examples 2-1 to 3 were molded articles that were excellent not only in the magnetic field shielding ability but also in the electric field shielding ability.

The invention claimed is:

1. An electromagnetic wave shielding material comprising:
    a first layer containing an inorganic fiber; and
    a second layer containing a metal fiber,
    wherein:
    an average fiber length of the inorganic fiber is 15 mm to 100 mm;
    an average fiber length of the metal fiber is 25 mm to 200 mm; and
    at least one of the first layer or the second layer contains a resin.

2. The electromagnetic wave shielding material according to claim 1, wherein
    the inorganic fiber contains at least one of a carbon fiber, a glass fiber, or a natural mineral fiber.

3. The electromagnetic wave shielding material according to claim 1, wherein
    the electromagnetic wave shielding material has a thickness of 0.5 mm to 6.0 mm.

4. The electromagnetic wave shielding material according to claim 1, wherein
    the electromagnetic wave shielding material has a weight per unit area of 500 g/m² to 5000 g/m².

5. The electromagnetic wave shielding material according to claim 1, wherein
    a content of the metal fiber, out of fibers contained in the second layer, is 90% or more.

6. The electromagnetic wave shielding material according to claim 1, wherein
    the resin is a thermoplastic resin.

7. A molded body comprising the electromagnetic wave shielding material according to claim 1.

8. The electromagnetic wave shielding material according to claim 1, wherein:
    the average fiber length of the inorganic fiber is 40 mm to 80 mm; and
    the average fiber length of the metal fiber is 80 mm to 120 mm.

9. A method for manufacturing an electromagnetic wave shielding material, the method comprising:
    laminating an inorganic-fiber-containing nonwoven fabric and a metal-fiber-containing nonwoven fabric; and
    heating and pressing the inorganic-fiber-containing nonwoven fabric and the metal-fiber-containing nonwoven fabric that have been laminated,
    wherein
    at least one of the inorganic-fiber-containing nonwoven fabric or the metal-fiber-containing nonwoven fabric contains a thermoplastic resin.

10. The method according to claim 9, wherein:
    an average fiber length of the inorganic fiber in the inorganic-fiber-containing nonwoven fabric is 15 mm to 100 mm; and
    an average fiber length of the metal fiber in the metal-fiber-containing nonwoven fabric is 25 mm to 200 mm.

11. The method according to claim 10, wherein:
    the average fiber length of the inorganic fiber in the inorganic-fiber-containing nonwoven fabric is 40 mm to 80 mm; and
    the average fiber length of the metal fiber in the metal-fiber-containing nonwoven fabric is 80 mm to 120 mm.

12. The method according to claim 9, wherein
    the inorganic fiber in the inorganic-fiber-containing nonwoven fabric contains at least one of a carbon fiber, a glass fiber, or a natural mineral fiber.

13. The method according to claim 9, wherein
    the electromagnetic wave shielding material has a thickness of 0.5 mm to 6.0 mm.

14. The method according to claim 9, wherein
    the electromagnetic wave shielding material has a weight per unit area of 500 g/m² to 5000 g/m².

15. The method according to claim 9, wherein
    a content of the metal fiber, out of fibers contained in the metal-fiber-containing nonwoven fabric, is 90% or more.

* * * * *